United States Patent [19]
Pratt et al.

[11] Patent Number: 5,228,138
[45] Date of Patent: Jul. 13, 1993

[54] SYNCHRONIZATION OF HARDWARE OSCILLATORS IN A MESH-CONNECTED PARALLEL PROCESSOR

[75] Inventors: Gill A. Pratt, Wellsey; John Nguyen, Cambridge, both of Mass.

[73] Assignee: Massachusetts Institute of Technology, Cambridge, Mass.

[21] Appl. No.: 644,922

[22] Filed: Jan. 23, 1991

[51] Int. Cl.⁵ ............................................. G06F 1/12
[52] U.S. Cl. .................................................. 395/550
[58] Field of Search .............. 364/DIG. 1, DIG. 2; 395/550, 575; 331/1 A, 25, 17

[56] References Cited

U.S. PATENT DOCUMENTS

| | | | |
|---|---|---|---|
| 3,716,802 | 2/1973 | Muratani | 331/8 |
| 3,920,915 | 11/1975 | Schlichte | |
| 4,074,080 | 2/1978 | Dragotinov et al. | |
| 4,689,577 | 8/1987 | Vreeken et al. | |
| 4,772,852 | 9/1988 | Viti | 331/1 A |
| 4,893,319 | 1/1990 | Ziuchkovski | |

OTHER PUBLICATIONS

Lindsey et al. "Network Synchronization by Means of a Returnable Timing System," *IEEE Transactions on Communications*, vol. COM-26, No. 6, Jun. 1978, pp. 892-896.

Manos Roumeliotis et al., "A distributed Fault Tolerant Clocking Scheme for Systolic Array Architectures," *The Computer Society of the IEEE*, Proceedings of the Phoenix Conference on Computers and Communications, Feb. 25-27, 1987, Scottsdale, AZ, pp. 105-109.

Herschel H. Loomis, Jr., et al., "A Scheme for Synchronizing High-Speed Logic" Part I, *IEEE Transactions on Computers*, vol. C-19, No. 1, Jan. 1970, pp. 39-47.

*Primary Examiner*—Robert L. Richardson
*Attorney, Agent, or Firm*—Hamilton, Brook, Smith & Reynolds

[57] ABSTRACT

A synchronized phase adjustment system provides relative synchronization of the clock oscillators in a mesh-connected parallel processor. Each node of a mesh contains an independent voltage controlled oscillator, and each node is linked to adjacent nodes by phase detectors. The phase differences between a node oscillator and the oscillators of adjacent nodes are combined by an input circuit the output of which is an average value applied to the node oscillator. The transfer function of the signal input to an oscillator relative to detected phase error indicates the restoring force (voltage) which is provided to adjust the phase of that oscillator. It is shown that a stable latch-up state in which all node phases of a mesh are not equal requires that one of the phase differences between two nodes is greater than $\pi/2$. Thus, the transfer function of the signal input to an oscillator is given a negative slope for phase differences having an absolute value between $\pi/2$ and $\pi$. For smooth response, the transfer function is given a positive slope for phase differences closer to zero, a particular embodiment having a transfer function with an absolute value between 0 and $\pi/2$.

29 Claims, 7 Drawing Sheets

SYNCHRONIZATION OF HARDWARE OSCILLATORS IN A MESH-CONNECTED PARALLEL PROCESSOR

BACKGROUND OF THE INVENTION

It has historically been difficult to distribute a well-aligned hardware clock throughout the physical extent of a synchronous processor. One problem with distributing a single clock signal is the different signal delay times which may affect the clock signal as it is distributed to different processors which are different physical distances from the clock source. To solve this problem, synchronous machines often use a clock distribution tree. This enables the physical distance to all the processors to be approximately the same. However, several disadvantages of such a structure exist particularly when it is used in a parallel processing domain. The use of a single clock signal with a vast distribution tree makes it likely that a failure at a single point of the clock tree affects many of the processors relying on the centralized clock signal. Furthermore, such a structure makes it difficult to expand the number of processors being utilized by a single machine, since the tree structure must be modified to accommodate the new processors.

SUMMARY OF THE INVENTION

The present invention provides a decentralized clocking system particularly useful for the control of a parallel processing machine. The clocking system relies on a number of oscillators each of which controls the clocking of a different portion of the machine. In order to provide synchronized control of all portions of the machine, it is necessary to synchronize all of the oscillators in the system. In the present invention, the multiple oscillators are synchronized to one another. The system relies on local phase comparisons to generate the signals necessary to bring all the oscillators of the system to a common phase.

A preferred embodiment of the invention has a plurality of phase-adjustable oscillators each of which generates an output clock signal. Each oscillator is located at a clock node of a network mesh. A phase detector is used between two adjacent nodes and measures the phase difference between the oscillators of the two nodes. The phase detector generates a phase error output which is used in adjusting the phase of the oscillators at the nodes between which the detector is located. Each of these oscillators has an input circuit through which phase error signals from phase detectors generate an input signal to the oscillator. A transfer function is defined from the phase error input of a phase detector to the output controlling the phase of an oscillator. Together, a phase detector and an input circuit make up a phase adjustor (along with any circuitry which might be required to adjust the characteristic of a particular phase detector component). The transfer function is such that the input circuit generates a restoring output which tends to reduce the detected phase error. In particular, the transfer function is such that the system is in a meta-stable phase state for relative phase differences greater than $\pi/2$. In a preferred embodiment, the transfer function has a slope which is negative for phase differences having an absolute value between $\pi/2$ and $\pi$. Thus, in this phase error region, the drive to an oscillator to decrease the error is lessened with increased phase error.

Providing the transfer function with a negative slope for the phase error regions $-\pi$ to $-\pi/2$ and $\pi/2$ to $\pi$ serves to destabilize modular "latch-up". It is shown that for a mesh-connected nodal arrangement, a modular latch-up condition requires that at least one relative phase error in the mesh be greater that or equal to $\pi/2$. However, the negative slope of the transfer function used herein is inherently unstable for conditions other than that in which all phases are equal. Thus, providing a negative slope in the phase error range $|\Phi| \geq \pi/2$ creates a meta-stable condition in this phase error range. This therefore prevents modular latch-up since no stable condition can result with a relative phase error greater than $\pi/2$.

In a preferred embodiment, the transfer function of the phase detector output is continuous, though not necessarily smooth, and has a positive slope for phase differences with an absolute value near zero. In one embodiment, the transfer function has a positive slope for the phase error range $|\Phi| \leq \pi/2$. This provides a smooth transition about the zero phase error point. In a mesh-connected parallel processor system, each clock node has an oscillator, and a separate phase difference is measured between each oscillator and the oscillator of each adjacent node. Each of these phase differences is measured by an individual phase detector which generates a phase error output. All of the phase error outputs relating to a node are combined and used by the input circuit for the oscillator of the node in question. The combined phase error is averaged over time by the input circuit and applied to the oscillator of the node to adjust the phase of the oscillator.

In a preferred embodiment, the normalized DC bias of the phase error transfer function is modified. Physically, each phase detector is realized using an exclusive OR (XOR) gate. Preferably, one of the two inputs to each XOR gate is given a $\pi/2$ phase delay to shift the phase error transfer function. This shifting is accomplished by feeding the output of each oscillator, a square wave, into a twisted ring counter of two flip-flops. Each ring counter provides two output signals, one of which has a $\pi/2$ phase delay. For one XOR gate, the delayed signal from the ring counter of a first oscillator is used as a first input, while the non-delayed signal from the ring counter of a second oscillator is used as a second input. For a second XOR gate, the non-delayed signal from the ring counter of the first oscillator is used, while the delayed signal from the ring counter of the second oscillator is used.

The outputs of the two XOR gates above are input differentially to a differential amplifier of the input circuit for each of the two oscillators. This provides a subtraction of the two XOR outputs which gives a normalized output range of $-1$ to $1$ rather than the $0$ to one normalized range of a single XOR output. The two XOR outputs are reversed as to their differential orientation when input to differential amplifiers of the input circuits of adjacent oscillators. Preferably, each input circuit includes damping of signals it receives, and averaging by arranging the differential amplifier as an integrator. This mutual connection arrangement is provided between each node and each of its neighboring nodes.

DETAILED DESCRIPTION OF PREFERRED EMBODIMENTS

The present invention uses a technique of synchronizing all the oscillators of a parallel processing system relative to each other. Using a phase comparison strategy, the relative phase differences between neighboring oscillators is determined and used to synchronize the oscillator signals. A preferred embodiment of the invention is applied to a mesh-connected parallel processing system. A schematic illustration of such a system is demonstrated in FIG. 1. The following description relates to a two-dimensional system, but it is believed that the concepts herein are easily expanded to a three-dimensional domain. Each of the nodes of the two-dimensional mesh of FIG. 1 contains one oscillator of the system. Each oscillator may control one or more processors of the overall machine, so the clock nodes need not have a one-to-one correspondence with processing nodes. Hereafter, the description is with regard to clock nodes. The number of oscillators contained in the system and the number of processors which each oscillator controls is specific to each application.

Figure 1:
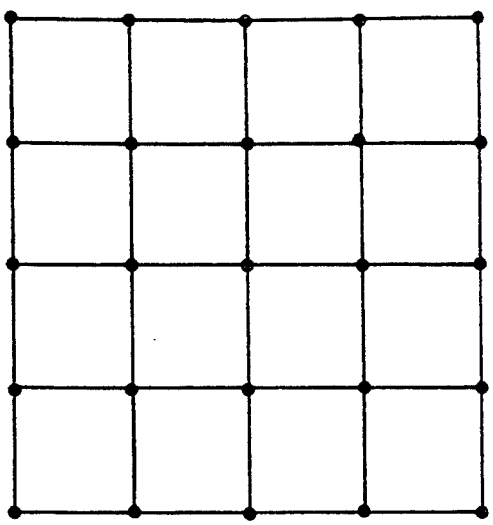
FIG. 1 is a schematic diagram of a two-dimensional mesh-connected parallel processor.

Each of the nodes in the mesh of FIG. 1 has four neighbors (except for those along the edges which have three, and those at the corners which have two. For the purposes of this description, each line connecting two nodes in FIG. 1 is called a link, and the line indicates the other nodes to which each node is connected for phase comparison purposes. To synchronize all the oscillators of the mesh, the relative phase error between nodes is measured for each link of the mesh. The phase error information for each link is applied to modify the phase of the oscillators coupled to that link to bring the phase of each oscillator closer to the phase of its neighbors. Changing the phase of an oscillator involves the use of a voltage controlled oscillator (VCO). A voltage controlled delay line (VCDL) might alternatively be used, but requires a centralized clock source signal, which defeats the goal of decentralization. With the phase (and frequency) of each oscillator node being adjustable with a VCO, the phase error measurements from each link connected to a node are used to adjust the phase of that node.

Since, in two dimensions, an oscillator node is ordinarily linked to four other nodes, four competing adjustment signals are generated for that node, each based on the phase error between the node in question and a neighboring node. A separate phase detector is used to detect the phase along each link of the mesh. Each phase detector outputs a signal which has an average value relative to the amount of the phase error detected. Since phase is a modular quantity, the magnitude of the output signal is restricted to a phase error range of $-\pi$ to $\pi$. How the phase detector signals are processed for use by the nodes of the system is important to ensure proper synchronization of the oscillators. In general, a transfer function exists between the phase error input to a phase detector and the phase-control output to an oscillator responding to that phase detector. A nominal transfer function selected for such a phase detector might have a linear characteristic, with the output voltage increasing with increasing phase error. An example of such a characteristic is shown in FIG. 2.

Figure 2:
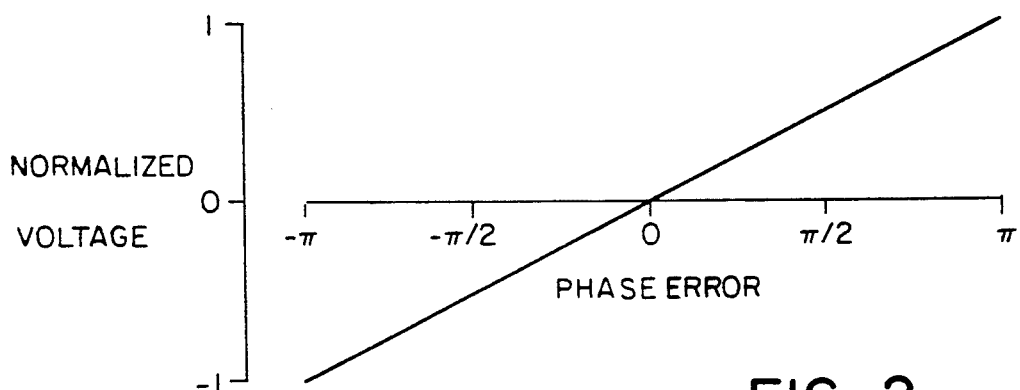
FIG. 2 is a positive-slope linear phase characteristic.

FIG. 2 shows how the normalized voltage output (analogous to a normalized force) of the linear transfer function relates to the phase error detected. As shown, this transfer function provides a normalized voltage which tends to force a VCO receiving the voltage signal to shift the phase of its oscillator to reduce the detected phase error. This curve has a desirable shape in that a positive voltage is provided in response to a positive phase error, and a negative voltage is provided in response to a negative phase error. For the oscillators of the present description, a positive voltage input to the VCO results in a decrease in the phase of the oscillator, while a negative voltage results in an increase in the phase of the oscillator. Since the phase error axis of a transfer function shows phase error relative to the node in question, this arrangement therefore provides a restoring force to the oscillator to restore the relative phase errors to zero. That is, the characteristic of FIG. 2 tends to force relative phase errors to a stable zero value.

An underlying problem with the characteristic of FIG. 2 becomes apparent when it is considered that a combination of four different voltage signals is typically received by the VCO for each node, one corresponding to the phase error along each link connected to the node. The signals from four phase detectors measuring the phase error between a subject node and four neighboring nodes are all combined for use by an input circuit to the oscillator of the subject node. With the linear transfer function of FIG. 2, a situation may arise in which the phases of the four nodes neighboring a node are different, but nonetheless generate phase errors which produce a combined voltage equal to zero. Thus, using the characteristic of FIG. 2, a "latch-up" condition may arise in which the system assumes a stable condition due to the combined (or average) voltage at each node oscillator being equal to zero. This condition is undesirable and can result in timing errors in a multiple processor domain.

Figure 3:
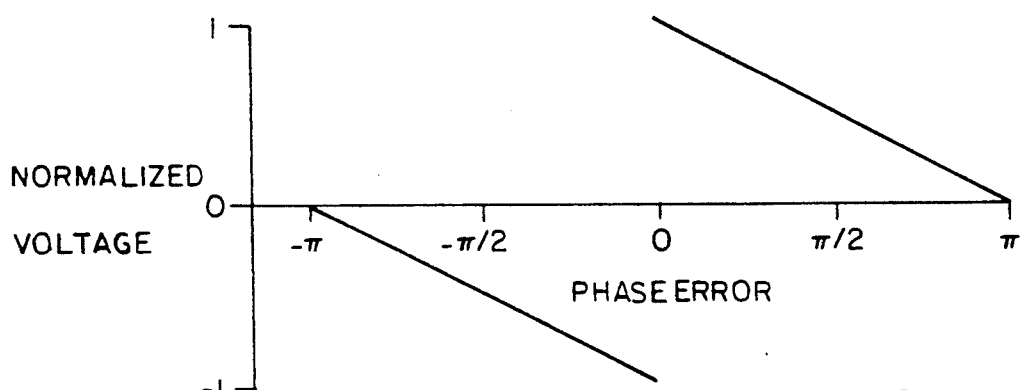
FIG. 3 is a phase characteristic having a negative slope and a discontinuity at zero phase error.

The phase detector characteristic of FIG. 2 has a positive slope which, if used for each of the phase detectors of a mesh system, tends to force the system to a stable state. However, this stable state may be any one of a number of relative phase relationships, many of which do not ensure that the phase of each node is equal. For this reason, a second embodiment is examined in which the phase characteristic of the detectors is as shown in FIG. 3. The characteristic of FIG. 3 retains the property of having positive and negative voltage outputs in response to positive and negative phase errors, respectively. Thus, like the characteristic of FIG. 2, the FIG. 3 characteristic tends to force the error toward zero. However, the slope of the characteristic is made negative rather than positive.

While the positive slope of the FIG. 2 characteristic tends to create relative stability in the system, the negative slope of the FIG. 3 characteristic tends to destabilize the system for all relative phase relationships except for when all phase errors equal zero. In FIG. 3 the absolute value of the normalized voltage generated by the phase detector increases as it approaches zero phase error. Thus, the restoring force for both negative and positive phase errors increases as the error is reduced. This tends to have a "down hill" type effect on any decrease of the phase error, driving the phase error to zero with increasing force (voltage) as the error is reduced.

The overall effect of the negative slope characteristic of FIG. 3 on a mesh system such as FIG. is a destabilization of relative phase relationships other than that in which all phases are equal. Thus, while four neighbors of a node could be found to have a combined phase which equals zero, a latch-up state using the characteristic of FIG. 3 would be unstable. Once one of the phases changed slightly, the down hill voltage characteristic of the detectors is invoked, and all the phases of the nodes are forced toward one another. With all the phase detectors of the mesh using this characteristic, the system quickly resolves itself to the only possible stable state, that in which all phases are equal.

The use of a phase detector characteristic of FIG. 3 for each link of a mesh provides the necessary convergence of all oscillators in the system to a common phase. However, the large discontinuity of the phase detector characteristic about the zero phase error point tends to cause the phase of the system clocks (oscillators) to "bang around" back and forth about the zero error point. A smoother transition at the zero point is more desirable as it reduces jitter in the output.

Figure 4:
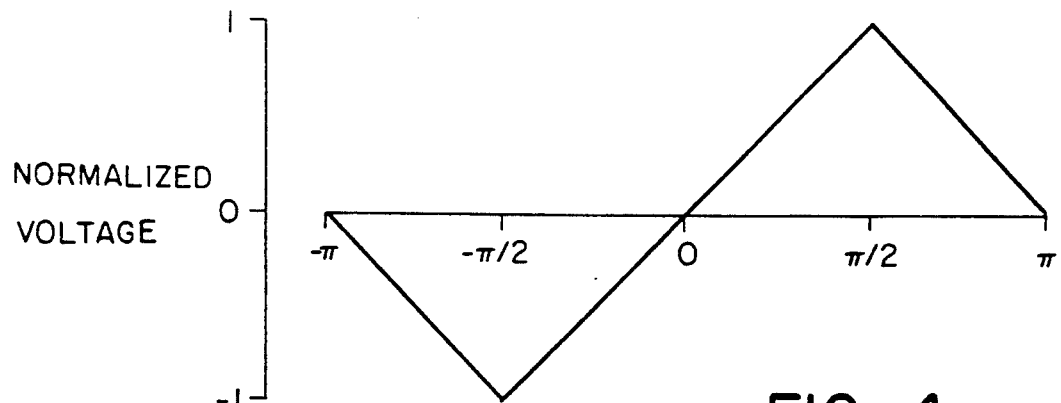
FIG. 4 is a preferred phase characteristic used with the phase comparators of the present invention.

A preferred embodiment of the present invention uses a phase detector characteristic which contains both the continuity advantages of the positive slope characteristic of FIG. 2 and the destabilization advantages of the negative slope curve of FIG. 3. This characteristic is shown in FIG. 4. The saw-tooth type waveform of FIG. 4 has a positive slope between $-\pi/2$ and $\pi/2$, and has a negative slope between $-\pi$ and $-\pi/2$ and between $\pi/2$ and $\pi$.

To demonstrate the effectiveness of the curve of FIG. 4 it is necessary to examine the latch-up potential of a mesh network. The following analysis demonstrates that in order for a mesh such as in FIG. 1 to be in a latch-up state, at least one of the links must have a phase error of at least 90°. This ensures that using the characteristic of FIG. 4, a latch-up state is unstable since one link has to have a phase error which falls into the negative slope region of the curve.

Figure 5:
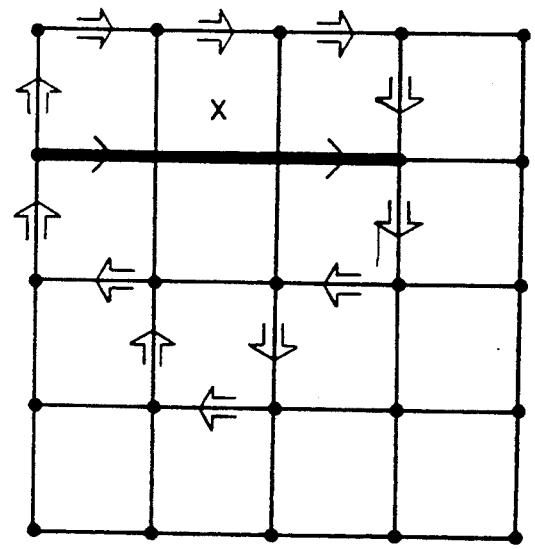
FIG. 5 is a schematic similar to FIG. 1 showing a path of phase errors through a mesh.

A mesh network in modular latch-up, by definition, has the phase of some of its nodes unequal. However, because the system is stable, the total force on each of the nodes is zero. FIG. 5 shows the mesh of FIG. 1 with arrows drawn between nodes of the system, the arrows pointing from a higher valued phase to a lower phase. The path of the arrows represents a possible sequence of relative phase errors. Since a positive phase error must be counterbalanced by at least one negative phase error in a latched-up system, the node at the head of an arrow must have at least one arrow pointing away from it. However, to be stable, the path of arrows must eventually run into itself.

Figure 6:
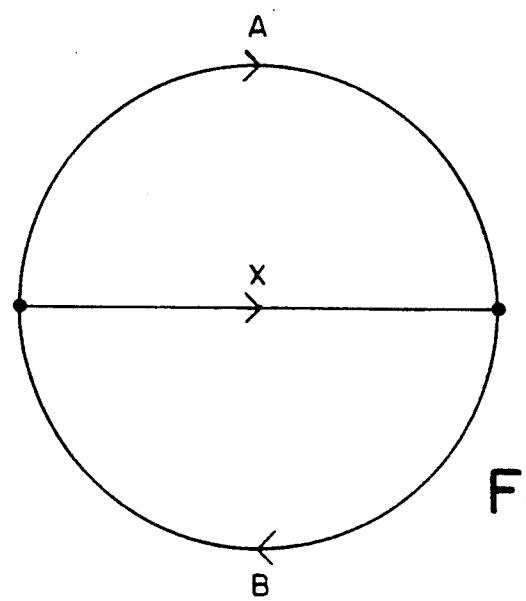
FIG. 6 is a diagram demonstrating the dividability of the phase error loop of FIG. 5.

Because of a modular equivalent of Kirchoff's voltage law, the sum of all phase errors added directionally in a loop must equal a multiple of $2\pi$. For the loop of FIG. 5, all arrows are in the positive direction, and it is thus also true that the loop sum is not zero. Because the mesh is finite and non-torus, the path of the phase errors, being larger than one square, may be divided into two smaller paths. An example of this is demonstrated in FIG. 5 if the line X is considered to be a dividing path. The overall divided path may now be represented by the diagram in FIG. 6. As shown, the original arrow path is divided into two paths A and B by the dividing path X. If the symbols A, B, and X are used to indicate the total phase error along their respective directed paths, the following relationships exist:

$$A + B = i(2\pi) \ (i \neq 0)$$

$$B + X = j(2\pi)$$

$$A - X = k(2\pi)$$

where i, j, and k are integers.

Combining the above equations, it can be shown that $$j + k = i \ (i \neq 0)$$

Either j or k must be non-zero, so that the two subpaths, like the larger path, must have incremental phase errors which sum to a non-zero multiple of $2\pi$. The above dividing process can be continued until the remaining path is only four links long (i.e. a single mesh square). Since the total phase error about a single mesh square must therefore be a non-zero multiple of $2\pi$, at least one of the links of the square must have a phase error which is a minimum of $\pi/2$.

The above analysis assumes nothing about the characteristics of the phase detector transfer function except that positive phase errors (between 0 and $\pi$) generate positive output force (voltage), and negative phase errors generate negative output force (voltage). The analysis demonstrates that at least one link of a mesh experiencing latch-up must have a phase error of at least $\pi/2$.

Knowing that a latch-up condition requires some phase error to be at least $\pi/2$, the phase adjustment characteristic of FIG. 4 is applied. The FIG. 4 characteristic has the required positive output for positive errors and negative output for negative errors. The negative slope of the FIG. 4 characteristic exists for errors less than $-\pi/2$ and greater than $\pi/2$. Since a latch-up condition requires a phase error in the negative slope range, the destabilizing effects of the negative slopes are sure to be in effect to bring the system out of the latch-up. It is noted that a transfer function ensures the necessary destabilization as long as the curve has a sufficiently negative slope for phase errors between $-\pi$ and $-\pi/2$, and between $\pi/2$ and $\pi$. The FIG. 4 characteristic shows a change from negative to positive slope at $-\pi/2$ and $\pi/2$, but the necessary destabilization still exists for other functions, as long as a negative slope is provided in the required region, and the function is positive for positive phase errors and negative for negative phase errors. A system having such a transfer function ensures meta-stable behavior (i.e. instability) at all points except where all the phase errors are zero. As a result, the overall system converges to a stable point from any initial configuration.

Figure 7:
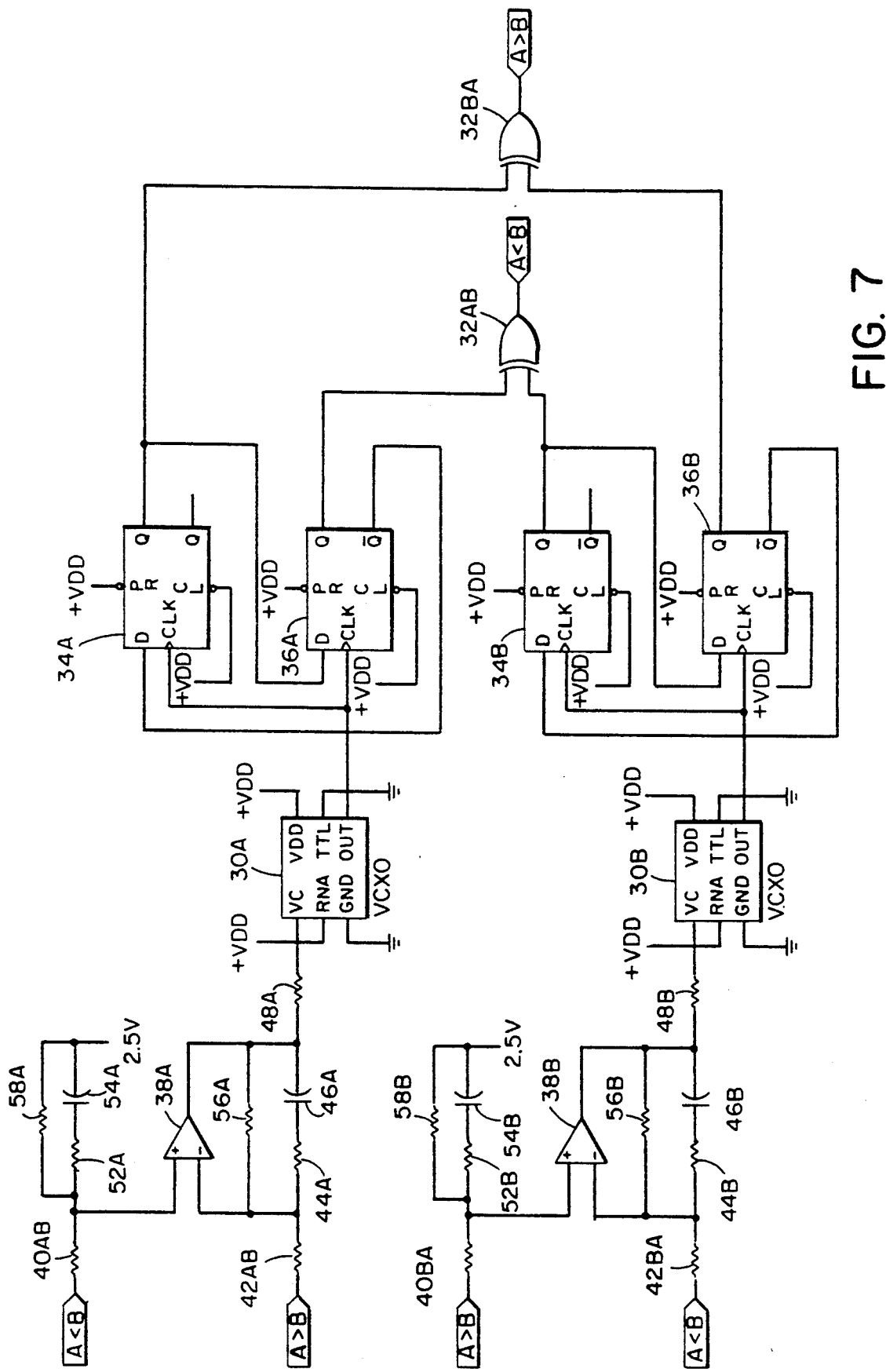
FIG. 7 is an electrical schematic showing an implementation of the characteristic of FIG. 4 for correcting phase error between two nodes.

A physical implementation of a synchronization circuit having the detector characteristic of FIG. 4 is shown in FIG. 7. The circuitry of FIG. 7 is arranged to control the relative phase adjustment of only two nodes, but demonstrates the implementation of the FIG. 4 characteristic. For identification purposes the two nodes being controlled are referred to as node A and node B. The circuit of FIG. 7 is therefore divisible into two parts, the part controlling node A and the part controlling node B.

Voltage controlled oscillator 30A is the central clock source for node A. Similarly, oscillator 30B is the clock source for node B. In the preferred embodiment, each of these VCOs is a VCXO (voltage controlled crystal oscillator). The central frequency of each VCO is the same, and is chosen to represent a desired clock rate for the processors of the multiple processor mesh. In the FIG. 7 embodiment, the TTL input of each VCO 30A, 30B is grounded such that the devices output CMOS voltage levels, although TTL levels may just as easily be used if an application so requires. The output frequency at the OUT terminal of each VCO 30A, 30B is changed by changing the input voltage to the VCO at its VC input. Phase changes for the VCOs are effected by short term frequency shifts.

Figure 8A:
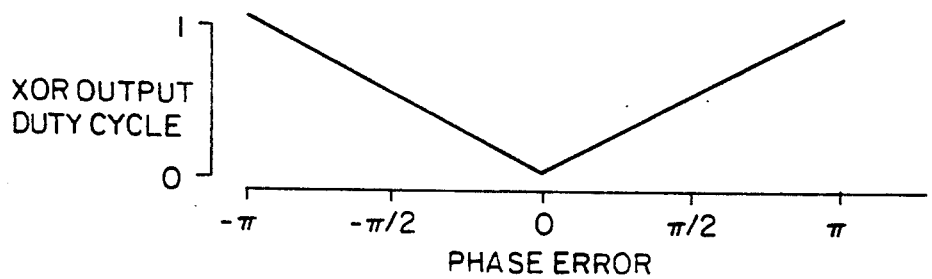
FIG. 8A shows the transfer characteristic of an XOR gate.
Figure 8B:
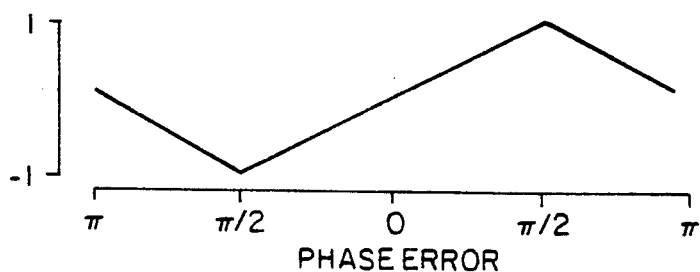
FIG. 8B shows the desired transfer characteristic of FIG. 4.

The phase detectors of the circuit are realized using XOR gates 32AB, 32BA. If two square waves of the same frequency are input to an XOR gate, the resulting output is a signal having pulses the width of which are proportional to the absolute value of the phase difference between the two input signals. The output signal is typically a voltage which varies between 0 V and the maximum voltage of the XOR gate. Therefore, the greater the phase difference between the input signals, the higher the average voltage of the output signal. A plot of the average output voltage relative to phase error for such an XOR gate phase detector is shown in FIG. 8A. For comparison, the desired FIG. 4 characteristic is shown in FIG. 8B. The XOR characteristic exhibits some of the triangle shaped properties necessary for the implementation of the characteristic of FIG. 4, but lacks in two areas. First, the normalized output range (i.e the DC bias) is between 0 and 1, rather than between $-1$ and 1. Furthermore, the minimum point of the characteristic is centered at zero phase shift, rather than at $-\pi/2$.

To properly center the output of the XOR characteristic, the relative phase shift of the two input signals is adjusted by delaying one of the signals by $\pi/2$. This shifts the XOR transfer function along the phase error axis. The delay of one of the signals is accomplished by feeding the output of each of the oscillators into a 2-bit ring counter. The ring counter for each of the node oscillators is made up of two D-type flip-flops. In FIG. 7, the ring counter for circuit A is made up of flip-flops 34A and 36A, while the ring counter for circuit B is made up of flip-flops 34B and 36B.

Figure 9:
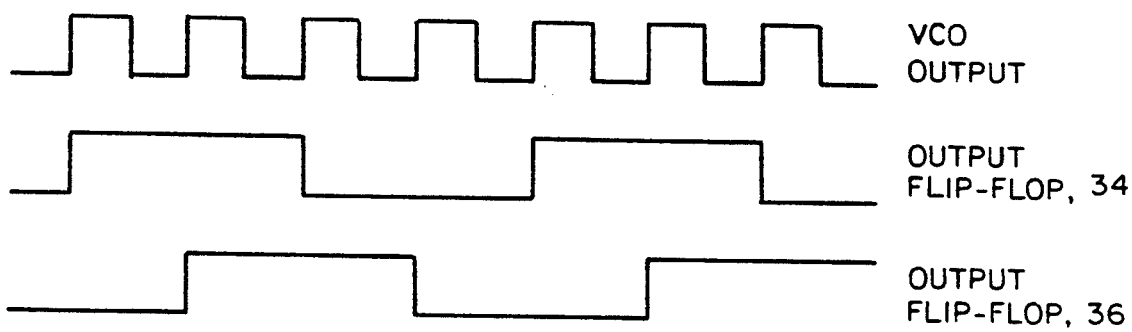
FIG. 9 shows the relative timing signals of a ring counter of the present invention.

For each of the circuit portions, the functioning of the ring counter is the same and the description immediately following is neutral as to the A and B designations of the ring counter components. The output signal from oscillator 30 is fed into the clock input of each of flip-flops 34 and 36. The non-inverted output of flip-flop 34 is fed into the D input of flip-flop 36, while the inverted output of flip-flop 36 is fed into the D input of flip-flop 34. This results in the two non-inverted outputs of the flip-flops being signals at ¼ the frequency of the VCOs and in quadrature relative to one another. As arranged, the output of flip-flop 36 lags the output of flip-flop 34 by 90°. The relationship between the oscillator output and the two quadrature outputs of the ring counter is shown in FIG. 9.

The XOR gates 32AB and 32BA of FIG. 7 each receive signals from both of the ring counters. Each gate uses a different one of the two flip-flop output signals from each ring counter. XOR gate 32AB receives outputs from flip-flops 36A and 34B. XOR gate 32BA receives outputs from flip-flops 34A and 36B. Thus, for XOR gate 32AB, the phase signal originating at oscillator 30A has an initial phase lag of 90° relative to that originating at 30B. For XOR gate 32BA, the phase signal originating at oscillator 30B has an initial phase lag of 90°. The output of XOR gate 32AB is labelled $A<B$, while the output of XOR gate 32BA is labelled $A>B$.

Figure 10:
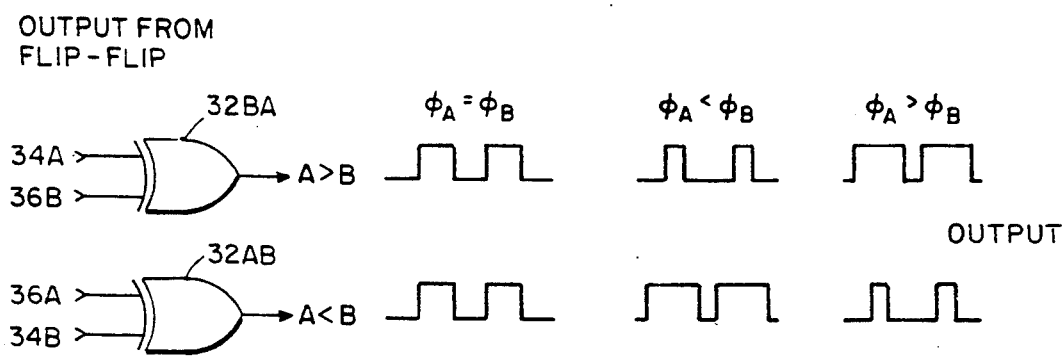
FIG. 10 shows the output from two cooperating XOR gates for different phase conditions.

FIG. 10 shows the two XOR gates and the outputs of the gates for different situations. As shown, when the phases of the two circuit portions are equal (i.e. $A=B$), the output from each of the gates is a 50% duty cycle signal, and the average output voltage of each is 0 V. When the phase of oscillator 30A is less than the phase of oscillator 30B (i.e. $\phi_A<\phi_B$), the average voltage of $A>B$ is low, and the average voltage of $A<B$ is high. Similarly, when the phase of oscillator 30A is greater than the phase of oscillator 30B (i.e. $\phi_A>\phi_B$), the average voltage of $A<B$ is high, while the average voltage of $A>B$ is low.

Figure 11A:
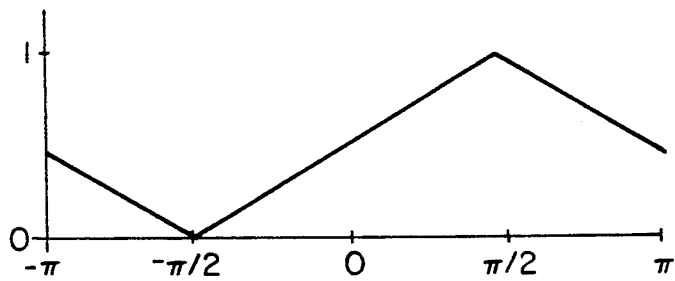
FIGS. 11A and 11B show the output characteristic for two cooperating XOR gates.
Figure 11B:
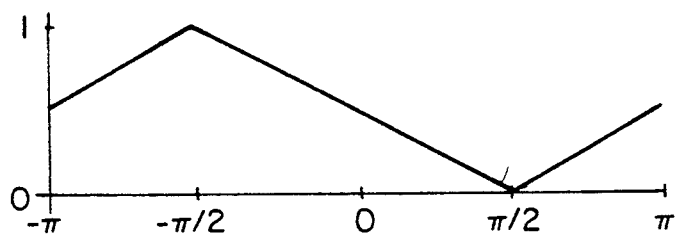

The two different average gate outputs represent two different transfer functions created from shifting an XOR transfer function two different directions. If, for comparison purposes, the phase error is arbitrarily defined as the difference $\phi_A-\phi_B$, the average outputs of the two XOR gates can be plotted relative to one another. FIG. 11A shows the average value of $A>B$, while FIG. 11B shows the average value of $A<B$. These output signals are applied to the input circuits of the two oscillators. But, since each node sees the relative phase shift differently, the signals are input to the input circuits of each node differently. Each input circuit includes a differential amplifier. The amplifier 38A receives signal $A<B$ at its non-inverting terminal and signal $A>B$ at its inverting terminal, while amplifier 38B receives signal $A>B$ at its non-inverting terminal and signal $A<B$ at its inverting terminal.

Figure 11C:
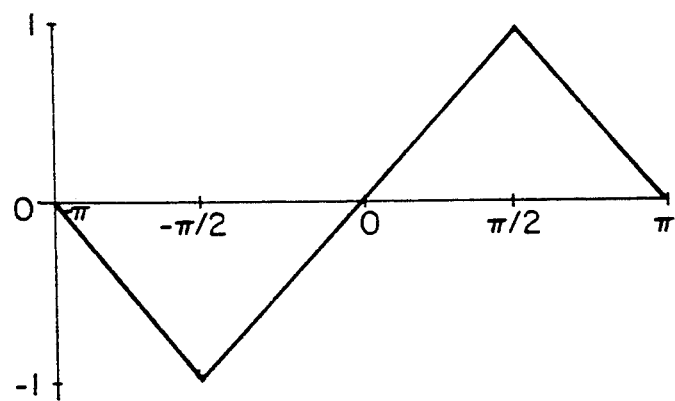
FIGS. 11C and 11D show the transfer functions resulting from the relative differences of FIG. 11A and FIG. 11B.
Figure 11D:
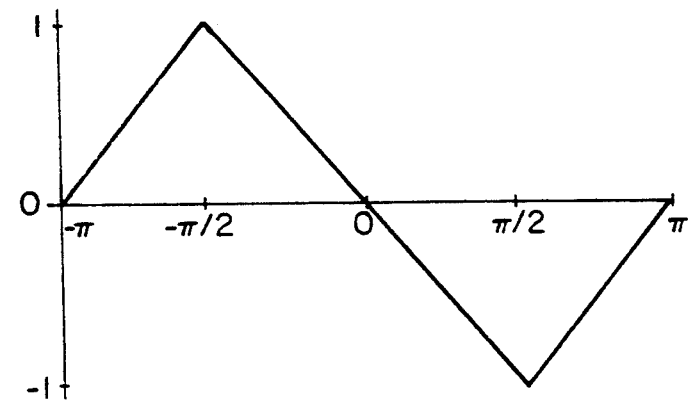

The differential input of the XOR gate output signals to the amplifiers 38A, 38B changes the DC bias of the overall transfer function. Thus, the amplifiers have normalized output values between $-1$ and 1 rather than between 0 and 1. This is best demonstrated by the curves shown in FIGS. 11C and 11D. The curve of FIG. 11C represents the characteristic of FIG. 11B subtracted from that of FIG. 11A. Similarly, FIG. 11D represents the characteristic of FIG. 11A subtracted from the characteristic of FIG. 11B. These relative difference functions correspond to the differential amplification by amplifiers 38A and 38B, respectively. Each of the resulting curves represents the desired characteristic of FIG. 4 relative to a different phase error reference. As mentioned above, the phase error axes of FIGS. 11A-11D assume the phase error to be $\phi_A - \phi_B$. Therefore, the curve of FIG. 11D appears to be upside down relative to the desired FIG. 4 characteristic. However, when noting that this characteristic is to be applied to circuit portion B (i.e. oscillator 30B of node B), it will be recognized that from the perspective of node B, the phase error axis of the curve should be defined as $\phi_B - \phi_A$. Therefore, for the differential arrangement of amplifier 38B, the characteristic of FIG. 11D is correct.

The two XOR gate output signals are used together to form the inputs to the two different amplifier circuits. Signal A<B is input to the non-inverting terminal of differential amplifier 38A through input resistor 40AB. Signal A>B is input to the inverting terminal through input resistor 42AB, which is matched to resistor 40AB. Capacitor 46A averages input A>B and integrates the output of the amplifier 38A which is thereafter fed into the VC input of VCO 30A. This integrated signal passes through current limiting resistor 48A. The integration of the signal allows the amplifier output to be an average voltage despite fast changing inputs from the XOR gates. Capacitor 54A is tied between a 2.5 V reference voltage and resistor 52A which is connected to the non-inverting terminal of the amplifier 38A. This branch matches the loading at the inverting input, and provides averaging of the signal A<B. The 2.5 V reference voltage also serves to bias the differential amplifier such that with feedback a center output voltage is 2.5 V. Resistors 44A and 52A are matched to each other, and provide damping to the system, tending to smooth out any fast changing inputs and preventing oscillation about zero phase error. Feedback resistor 56A is provided for frequency centering purposes and is discussed below. Resistor 58A is provided to match resistor 56A and keep the loading a both input terminals equal.

The circuit of amplifier 38A provides an output to VCO 30A which is an average voltage proportional to the difference (A<B − A>B). As discussed above, the transfer function of that output relative to detected phase error is identical to that of FIG. 4. The circuit of amplifier 38B feeds VCO 30B and operates in a manner essentially identical to that of the circuit of amplifier 38A. However, the circuit of amplifier 38B provides an output which feeds the VC input of VCO 30B and which is an average voltage proportional to the difference (A>B − A<B). From the perspective of node B, this output also has a transfer function relative to the detected phase error which is identical to that of FIG. 4. Thus, the voltages generated at the inputs of the VCOs 30A, 30B are such that each VCO responds by changing the phase of its output to try to reduce the phase difference. But, since the relative comparison of the phase detector outputs is reversed for each of the amplifier circuits, each VCO changes its output phase toward the phase of the other VCO, thus providing the convergence of the phases.

Resistor 56A is a feedback resistor which provides a small amount of feedback current to the inverting input of comparator 38A. Because of the 2.5 V reference voltage, this feedback tends to push the amplifier output to 2.5 V. For the VCOs of the present embodiment, the VCO frequency is centered for a 2.5 V input to the VCO. Therefore, this feedback tends to draw the VCO into the center of its frequency range. Resistor 56B functions in the same way, but for the comparator circuit of VCO 30B. At the cost of a small amount of phase error, these feedback resistors help prevent the VCOs from getting pushed to the limits of their ranges as the phases are adjusted relative to one another.

Figure 12:
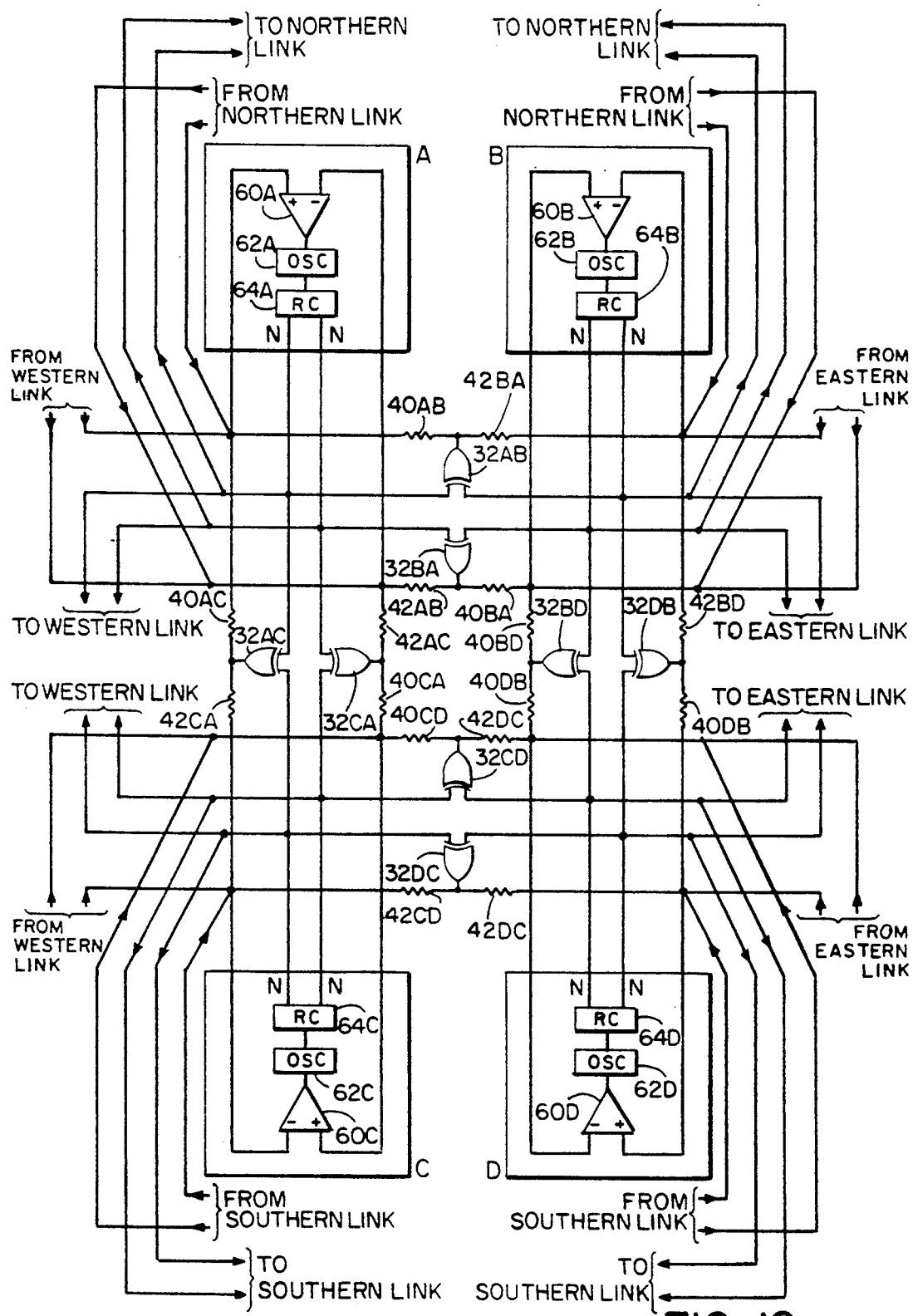
FIG. 12 shows a connection arrangement of four phase detectors between four adjacent nodes of a system using the FIG. 4 phase characteristic.

FIG. 12 shows the connection relationship between four different nodes of a mesh. The nodes are labelled A,B,C, and D. Each of the amplifier circuits is shown as a single amplifier element 60A, 60B, 60C, 60D, but it will be understood that each of these amplifier symbols actually represents an input differential amplifier circuit similar to one of those shown in FIG. 7. The output of each amplifier is fed into a voltage controlled oscillator 62A, 62B, 62C, and 62D, respectively. The output of each oscillator is input to a ring counter 64A, 64B, 64C, and 64D, respectively, each of which is like one of those shown in FIG. 7.

Each ring counter has two outputs phase shifted 90° relative to each other which are used by the phase detection circuitry. These outputs are labelled p1 and p2 for each node. The XOR gates 32 of the system are connected with load resistances 40, 42 as shown. The labelling of each of the XOR gates and the input resistances is similar to that of FIG. 7, and indicates how the signals are being used by the system. For the XOR gates, the first post-script designation indicates the node which is receiving the output of that XOR gate at the non-inverting input of its differential amplifier. The second post-script designation indicates the node which is receiving the output of the gate at the inverting input of its differential amplifier. Thus, as shown in both FIG. 12 and FIG. 7, the output of XOR gate 32AB is input to the non-inverting terminal of amplifier 38A and also to the inverting input of amplifier 38B.

The labelling for the input resistors also indicates the nodes involved, as in FIG. 7. The first post-script designation for the input resistors indicates the node with which that resistor is associated. The second post-script designation indicates the node to which a phase error measurement is being made relative to that resistor's node. The numeric designations of 40 and 42 are retained to indicate the non-inverting terminal input resistor and the inverting terminal resistor, respectively. Therefore, resistor 40AB is an input resistor for the non-inverting terminal of the node A amplifier, and receives a signal from XOR gate 32AB, which is a comparison of the phases of node A and node B. Similarly, resistor 42BA is an input resistor for the inverting terminal of the node B amplifier, and also receives a signal from XOR gate 32AB, which is a comparison of the phases of node A and node B.

Each XOR gate compares the p1 output of one node's ring counter to the p2 output of another node's ring counter. The XOR gate outputs are connected to the nodes such that the XOR gate output that is considered in a positive manner by one node is considered in a negative manner by another node. This ensures that the relative comparisons of the XOR outputs force the phases of the VCOs to converge. The topology shown in FIG. 12 may be extended to a two-dimensional mesh of any size. Input and output lines extending from the circuit of FIG. 12 show how eight other nodes to the North, South, East, and West are connected to the four node mesh. In addition to two-dimensional extension, the mesh may be extended into three dimensions as well. In such a case, each node has two additional links which extend to its two additional neighbors. These links would extend into and out of the page if connected to FIG. 1. Thus, similar three-dimensional modifications would be made to extend the electrical diagram of FIG. 12.

For a three-dimensional mesh, each node typically has six neighbors rather than four. With the increasing density of parallel processing systems, it is likely that the three-dimensional mesh will become the standard of the future. The expansion of the two-dimensional example of FIG. 12 to a three-dimensional domain involves the addition of two phase comparisons for each node. The simple modifications to the FIG. 12 embodiment involve adding the necessary amplifier circuit, VCO, and two flip-flops for each node, and adding the two required XOR gates for each link. The expansion of the system to three dimensions simply requires the addition of connections to the existing two-dimensional mesh. The broad variety of transfer functions which are available to properly control the two-dimensional mesh may not be available in the three-dimensional domain. However, the basic concept of destabilizing the system with a negative slope transfer function for the range in which maximum phase errors reside is unchanged.

In general, the amplifiers of the present invention do a weighted subtraction of as many nodes as are linked to it. Each node has a amplifier circuit, a voltage controlled oscillator, and two flip-flops. Each link has two XOR gates. To expand an existing system, no overall reconfiguration is necessary, as is the case with a single clock distribution tree. The nodes may simply be added onto the system as required. Another significant advantage of the above embodiment is that if one oscillator of the system fails, the entire system is not at risk. The failed oscillator produces a zero frequency output, so that a zero voltage is input to the XOR gate from that node. However, the XOR gate will simply produce a 50% duty cycle output as it tracks the input from a second node, resulting in a no error signal net average voltage of zero. Other nodes to which the second node is connected keep the phase of that node consistent with their own.

Figure 13:
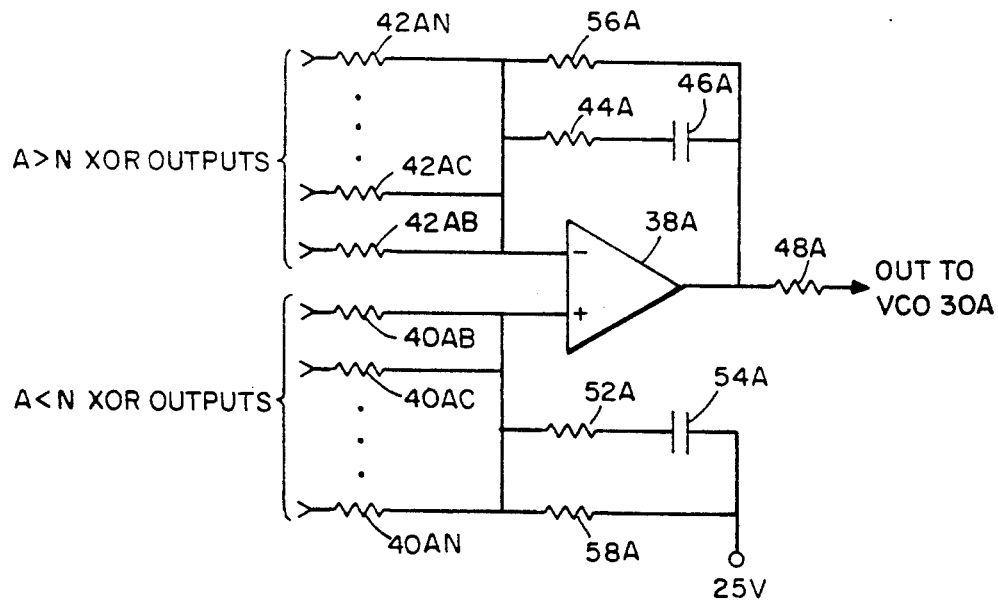
FIG. 13 shows the input circuit for node A connected to N nodes.

An example of how connections to a node might be expanded is demonstrated by FIG. 13. FIG. 13 shows the input connections to node A for N different neighboring nodes. The designation N is used to represent the possible letter designation of the highest order node (i.e. neighboring nodes are A, B, C, ..., N). All of the A<N inputs (A<B, A<C, ..., A<N) are combined at the inverting terminal of amplifier 38A through input resistances 40AB through 40AN. Similarly, all the A>N inputs (A>B, A>C, ..., A>N) are combined at the inverting terminal of amplifier 38A through resistances 42AB through 42AN. Thus, it can be seen that the expansion of the two dimensional configuration shown is a simple matter of adding the necessary links and inputs to each node.

While the invention has been particularly shown and described with reference to a preferred embodiment thereof, it will be understood by those skilled in the art that various changes in form and details may be made therein without departing from the spirit and scope of the invention as defined by the appended claims. For example, as an alternative way to provide the necessary DC bias shift, the XOR gates could be referenced to a 50% duty cycle voltage instead of to zero volts. This results in the average voltage output by the XOR gate having negative as well as positive values, such that the normalized output range is between $-1$ and 1. In addition, the transfer functions of the system need not change slope right at $-\pi/2$ and $\pi/2$. As long as a negative slope is maintained for phase errors $\phi \geq |\pi/2|$, the destabilizing effect of the negative slope prevents modular latch-up. Extremely non-linear transfer functions may hinder the destabilization effect, but in general the slope changes may occur anywhere in the range $-\pi/2 - \pi/2$.

We claim:

1. A synchronized timing system comprising:
a plurality of phase-adjustable oscillators; and
a phase adjustor comprising a phase detector measuring a phase difference between two oscillator output signals, the phase adjustor generating a control output which is applied to the oscillators to reduce said phase difference, a transfer function of the phase adjustor being such that the system is in a meta-stable phase state when said phase difference has an absolute value between $\pi/2$ and $\pi$.

2. A system according to claim 1 wherein the transfer function has a slope which is negative for phase differences having an absolute value between $\pi/2$ and $\pi$.

3. A system according to claim 1 wherein the synchronized timing system is part of a mesh-connected parallel processing system having a mesh with a plurality of nodes.

4. A system according to claim 3 wherein the mesh-connected parallel system is a two-dimensional mesh-connected parallel processing system.

5. A system according to claim 3 wherein each oscillator is part of an individual clock source located at a different node of a parallel processing mesh.

6. A system according to claim 5 wherein said phase detector is one of a plurality of phase detectors each of which detects a phase difference between two adjacent nodes of the mesh.

7. A system according to claim 6 wherein the phase of each oscillator is adjusted in response to a combined signal from phase detectors each measuring the phase difference between that oscillator and an oscillator from an adjacent node.

8. A system according to claim 1 wherein the oscillators comprise voltage controlled oscillators.

9. A system according to claim 1 wherein said transfer function is such as to force the phases of said two oscillators toward each other.

10. A system according to claim 1 wherein the phase detector comprises an XOR gate.

11. A system according to claim 10 wherein the outputs from said two oscillators are input to the phase detector, and one of the outputs of said two oscillators is given a 90° phase delay relative to the output of the other of said two oscillators.

12. A system according to claim 10 wherein said phase delay is provided by inputting the output of each of said two oscillators to a twisted ring counter, each ring counter providing a delayed output and a non-delayed output.

13. A system according to claim 12 wherein the delayed output of a first ring counter is input to an XOR gate with the non-delayed output of a second counter.

14. A system according to claim 13 wherein the XOR gate is a first XOR gate and a second XOR gate is provided to which is input the non-delayed output of the first ring counter and the delayed output of the second ring counter.

15. A system according to claim 14 further comprising a differential amplifier which provides a control output to a first one of said two oscillators, the output of the first XOR gate being input to the non-inverting terminal of the differential amplifier while the output of the second XOR gate is input to the inverting terminal of the differential amplifier.

16. A system according to claim 15 wherein the differential amplifier is an integrating differential amplifier and the control output of the amplifier is averaged over time.

17. A system according to claim 16 wherein the differential amplifier is a first differential amplifier and the system further comprises a second differential amplifier which provides a control output to a second one of said two oscillators, the output of the second XOR gate being input to the non-inverting terminal of the second differential amplifier while the output of the first XOR gate is input to the inverting terminal of the second differential amplifier.

18. A system according to claim 1 wherein said transfer function has a positive slope for phase differences having an absolute value between 0 and $\pi/2$.

19. A system according to claim 18 wherein said transfer function is continuous over the range of phase differences between $-\pi$ and $\pi$.

20. A synchronized timing system comprising:
a plurality of phase-adjustable oscillators each generating an output signal; and
a phase adjustor comprising a plurality of phase detectors each measuring a phase difference between two of the oscillator output signals, each phase detector providing a phase error signal to an input circuit which generates a control output to an oscillator to adjust the phase of the oscillator to reduce said phase difference, the phase adjustor having a transfer function which describes how a detected phase difference relates to a generated control output, the transfer function having a slope which is negative for phase differences with an absolute value between $\pi/2$ and $\pi$, and which slope is positive for phase differences having an absolute value between 0 and $\pi/2$.

21. A mesh-connected parallel processor system comprising:
a plurality of phase-adjustable oscillators each located at a mesh node, and each generating an output signal;
a plurality of twisted ring counters each receiving the output signal from one of the oscillators, the ring counters each outputting a delayed signal and a non-delayed signal in response to the oscillator signal received;
a plurality of XOR gates each receiving the delayed signal from one ring counter and the non-delayed signal from another ring counter, each XOR gate generating a phase detection signal in response thereto;
a plurality of differential amplifier input circuits each receiving one phase detection signal from each of two different XOR gates, one phase detection signal being input to the non-inverting terminal of a differential amplifier while a second phase detection signal is input to the inverting terminal of that differential amplifier, each differential amplifier generating an integrated output control signal which is input to an oscillator to adjust the phase of that oscillator.

22. A method of synchronizing phase-adjustable oscillators of a synchronized timing system, the method comprising:
providing a phase adjustor having a phase detector which detects a phase difference between two oscillator output signals;
generating with the phase adjustor a control output which is applied to an oscillator to reduce said phase difference, the control output being generated in response to said phase difference, a transfer function of the phase adjustor which describes how the control output relates to said phase difference being such that the system is in a meta-stable phase state when said phase difference has an absolute value between $\pi/2$ and $\pi$.

23. A method according to claim 22 wherein the step of generating a control output is such that the transfer function has a slope which is negative for phase differences having an absolute value between $\pi/2$ and $\pi$.

24. A method according to claim 22 wherein the step of providing a phase adjustor further comprises providing a phase adjustor having a plurality of phase detectors each of which detects a phase difference between two nodes of a mesh-connected parallel processor system.

25. A method according to claim 24 wherein providing a phase adjustor having a plurality of phase detectors comprises providing a plurality of phase detectors each of which detects a phase difference between two nodes of a two-dimensional mesh-connected parallel processing system.

26. A method according to claim 22 wherein the step of providing a phase adjustor further comprises providing a phase detector comprising an XOR gate.

27. A method according to claim 22 wherein the step of generating a control output is such that the transfer function has a slope which is positive for phase differences having an absolute value between 0 and $\pi/2$.

28. A method according to claim 22 wherein the step of generating a control output is such that the transfer function is continuous over the range of phase differences between $-\pi$ and $\pi$.

29. A method of synchronizing a plurality of phase-adjustable oscillators of a mesh-connected parallel processing system, the method comprising:
providing a phase adjustor having a plurality of phase detectors each of which detects the phase difference between two oscillator output signals;
generating with the phase adjustor a plurality of control outputs each provided to a different oscillator to reduce a detected phase difference, each particular control output being generated in response to a phase difference detected between the oscillator to which the particular control output is applied and an oscillator of an adjacent mesh node, a transfer function of the phase adjustor being definable which describes how a control output relates to a phase difference to which that control output responds, the transfer function having a negative slope for phase differences having an absolute value between 0 and $\pi/2$.

* * * * *

UNITED STATES PATENT AND TRADEMARK OFFICE
CERTIFICATE OF CORRECTION

PATENT NO. : 5,228,138

DATED : July 13, 1993

INVENTOR(S) : Gill A. Pratt and John Nguyen

It is certified that error appears in the above-identified patent and that said Letters Patent is hereby corrected as shown below:

In column 1, following the title, insert as the first paragraph:

--<u>Government Support</u>
This invention was made with government support under Grant No. N00014-89-J-1988 by the Navy. The government has certain rights in the invention.---

Signed and Sealed this

Fifth Day of April, 1994

*Attest:*

BRUCE LEHMAN

*Attesting Officer*     *Commissioner of Patents and Trademarks*